(12) United States Patent
Chen et al.

(10) Patent No.: US 10,704,544 B2
(45) Date of Patent: *Jul. 7, 2020

(54) FLUID TRANSPORTATION DEVICE

(71) Applicant: Microjet Technology Co., Ltd., Hsinchu (TW)

(72) Inventors: Shih-Chang Chen, Hsinchu (TW); Jia-Yu Liao, Hsinchu (TW); Chi-Feng Huang, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 212 days.

This patent is subject to a terminal disclaimer.

(21) Appl. No.: 15/875,469

(22) Filed: Jan. 19, 2018

(65) Prior Publication Data
US 2018/0209411 A1    Jul. 26, 2018

(30) Foreign Application Priority Data
Jan. 20, 2017  (TW) .............................. 106102044 A (51) Int. Cl.
  *F04B 43/04*    (2006.01)
  *F04B 17/00*    (2006.01)
  (Continued)

(52) U.S. Cl.
  CPC .......... *F04B 43/046* (2013.01); *F04B 17/003* (2013.01); *F04B 19/006* (2013.01);
  (Continued)

(58) Field of Classification Search
  CPC ...... F04B 17/003; F04B 19/006; F04B 19/20; F04B 43/043; F04B 43/046; F04B 53/106
  See application file for complete search history.

(56) References Cited

U.S. PATENT DOCUMENTS 6,565,520 B1 *  5/2003  Young .................. A61B 8/0875
  601/2
6,882,085 B2 *  4/2005  Komoda .............. H02N 2/0045
  310/323.02

(Continued)

FOREIGN PATENT DOCUMENTS

CN    101520040 A    9/2009
CN    101550929 A    10/2009
(Continued)

OTHER PUBLICATIONS

Indian Office Action for Indian Application No. 201824002283, dated Nov. 13, 2019, with English translation.

*Primary Examiner* — Dominick L Plakkoottam
(74) *Attorney, Agent, or Firm* — Birch, Stewart, Kolasch & Birch, LLP (57) ABSTRACT

A fluid transportation device for transportation fluid comprises a valve main body, a valve chamber base, a valve membrane, an actuator and a cover body, and locked and positioned by several locking elements, the electrically conductive locking elements are correspondingly penetrated through the penetration holes of the valve main body, the valve chamber base and the vibration plate of the valve membrane to lock with the corresponding screw holes, and a plurality of thread grooves respectively disposed on the vibration plate, the valve main body and the valve chamber base are corresponding to two thread grooves of the cover body, and an electrode lead of the piezoelectric element is embedded into the two thread grooves of the cover body and embedded into the thread grooves of the vibration plate, valve main body and the valve chamber base, so that the fluid transportation device is assembled.

5 Claims, 11 Drawing Sheets

(51) Int. Cl.
  *F04B 19/00*  (2006.01)
  *H01L 41/09*  (2006.01)
  *F04B 53/16*  (2006.01)
  *F04B 43/02*  (2006.01)
  *F04B 53/10*  (2006.01)

(52) U.S. Cl.
  CPC .......... *F04B 43/028* (2013.01); *F04B 43/043* (2013.01); *F04B 53/106* (2013.01); *F04B 53/16* (2013.01); *H01L 41/09* (2013.01)

(56) References Cited

U.S. PATENT DOCUMENTS

| | | | |
|---|---|---|---|
| 8,579,404 B2 * | 11/2013 | Arimura | B41J 2/14274 |
| | | | 347/17 |
| 2012/0187806 A1 * | 7/2012 | Hirai | H01L 41/0835 |
| | | | 310/366 |
| 2013/0213506 A1 * | 8/2013 | Chen | F16K 11/24 |
| | | | 137/597 |

FOREIGN PATENT DOCUMENTS

| | | | |
|---|---|---|---|
| CN | 101566145 A | | 10/2009 |
| CN | 101581291 A | | 11/2009 |
| CN | 202900570 U | | 4/2013 |
| CN | 103256210 A | | 8/2013 |
| CN | 101550926 B | | 3/2014 |
| CN | 103915285 A | | 7/2014 |
| EP | 2107243 A2 | | 10/2009 |
| TW | I557321 B | | 11/2016 |

* cited by examiner

FLUID TRANSPORTATION DEVICE

FIELD OF THE INVENTION

The present invention relates to a fluid transportation device, and more particularly to a fluid transportation device having a micro-pump structure.

BACKGROUND OF THE INVENTION

In the fields of medical, computer technology, print and energy industrials, the products are developed towards miniaturization, and the fluid transportation device included in a micro-pump, a sprayer, an inkjet head or an industrial print device therein plays a key role. As so, it is important for industry to create innovative structure of the fluid transportation device to maintain compact size and improve its performance.

Figure 1A:
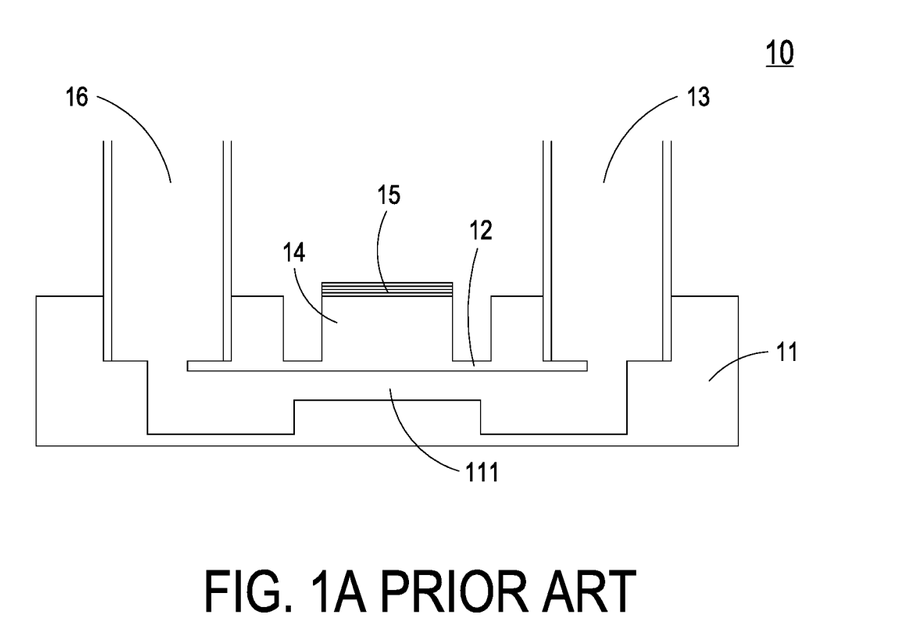
FIG. 1A schematically illustrates a micro-pump structure of prior art that is not in action.
Figure 1B:
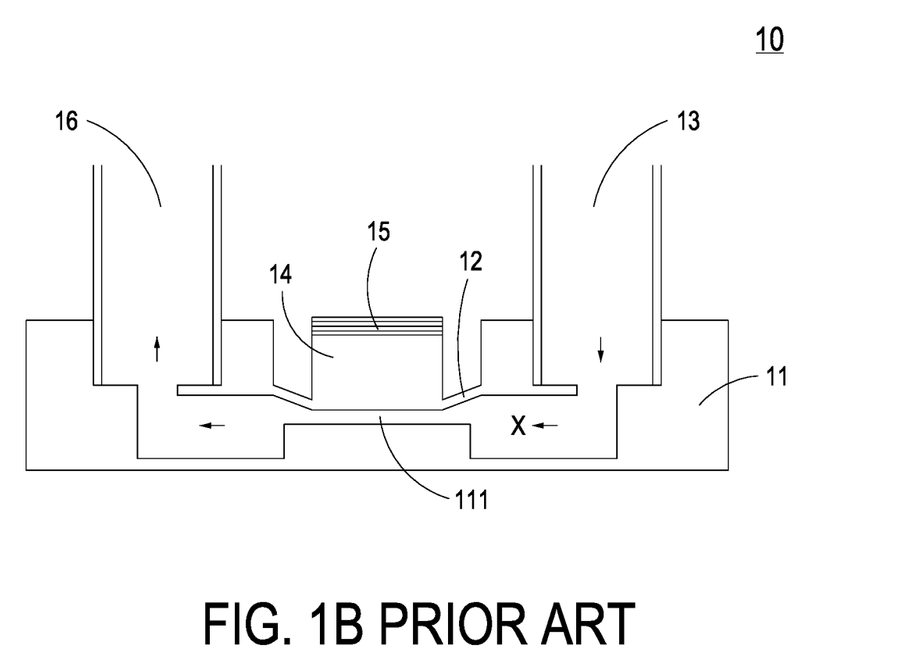
FIG. 1B schematically illustrates the micro-pump structure of FIG. 1A that is in action.

Please refer to FIGS. 1A and 1B. FIGS. 1A and 1B schematically illustrate a micro-pump structure of prior art. The micro-pump structure 10 is not in action in FIG. 1A, whereas it is in action in FIG. 1B. The micro-pump structure 10 of prior art contains an inlet channel 13, a micro-actuator 15, a transportation block 14, a layer-isolating film 12, a compression chamber 111, a substrate 11 and an outlet channel 16. The compression chamber 111 is defined and formed in between the substrate 11 and the layer-isolating film 12 and mainly used for storing liquid. The volume of the compression chamber 111 would be changed by the deformation of the layer-isolating film 12.

When the micro-pump structure 10 is in action, a voltage is applied to the upper and lower poles of the micro-actuator 15 and an electric field is generated. As shown in FIG. 1B, the micro-actuator 15 is bent along the electric field, moving downwardly in the direction towards the layer-isolating film 12 and the compression chamber 111. The transportation block 14 located under the micro-actuator 15 transmits the thrust by the micro-actuator 15 to the layer-isolating film 12, such that the layer-isolating film 12 is also pressed and deformed. As a result, the volume of the compression chamber 111 is shrunken, and the liquid which has entered by the inlet channel 13 and has been stored in the compression chamber 111 is compressed by the compression chamber 111, forming an liquid flow flowing in the direction X through the outlet channel 16 to a predetermined container to achieve liquid transportation.

Figure 2:
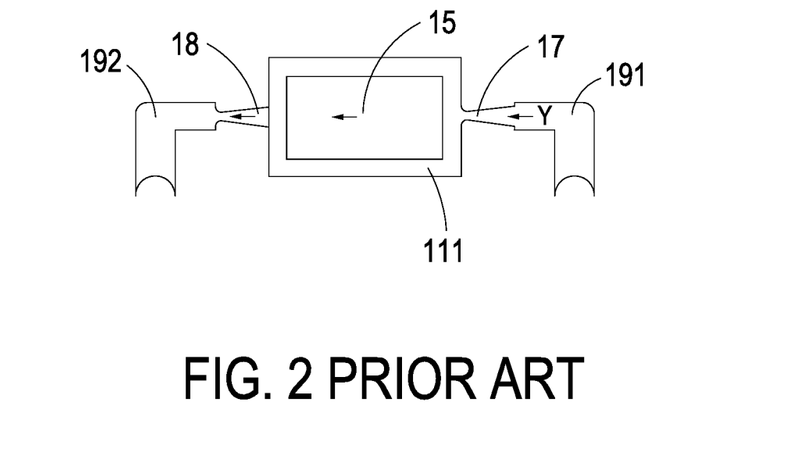
FIG. 2 schematically illustrates a top perspective view of the micro-pump structure of FIG. 1A.

Please refer to FIG. 2. FIG. 2 schematically illustrates a top view of the micro-pump structure of FIG. 1A. As shown in figure, when the micro-pump structure 10 is operating, the liquid is transported in the direction Y. The inlet diffuser 17 is a tapered structure having two openings in different sizes at two ends, wherein the end with the larger opening is connected with the inlet flow passage 191, and the end with the smaller opening is connected with the compression chamber 111. Similarly, the outlet diffuser 18 is disposed in the same direction with the inlet diffuser 17, as the end thereof with larger opening is connected with the compression chamber 111, and the end thereof with the smaller opening is connected with the outlet flow passage 192. Each of the inlet diffuser 17 and the outlet diffuser 18 provides different flow resistances in two ends thereof, this characteristics plus the expansion and contraction of the volume of the compression chamber 111 can make the liquid flow at an unidirectional net flow rate, from the inlet flow passage 191 through the inlet diffuser 17 to the compression chamber 111, and through the outlet diffuser 18 to the outlet flow passage 192.

However, the above-mentioned micro-pump structure 10 does not have any solid valve and a large amount of backflow is usually happened. Therefore, it is necessary to raise the compression ratio of the compression chamber 111 to generate sufficient pressure therein that increases flow rate of the liquid. Consequently, the cost of the micro-actuator 15 is higher.

Therefore, there is a need of providing an improved fluid transportation device distinct from the prior art in order to solve the above drawbacks, which can keep certain working characteristics and flow rate in long-term utilization.

SUMMARY OF THE INVENTION

The main purpose of the present invention is to provide a fluid transportation device. The fluid transportation device is assembled and formed by sequentially stacking a valve main body, a valve membrane, a valve chamber base, an actuator and a cover body, and locked and positioned by several locking elements. In the design of locking positioning and assembling the fluid transportation device with the locking elements, the electrically conductive locking elements are used to simplify conductive wiring of the device, and the metallic cover body is in contact with the vibration plate by a whole surface that the area for conducting electricity of the vibration plate is increased. Hence, the poor conduction of electricity of the vibration plate is prevented, and the locking elements can be used to slightly adjust performance of conducting electricity. Furthermore, the electrode lead is embedded in and protected by several lead grooves so as to prevent damage.

In accordance with an aspect of the present invention, there is provided a fluid transportation device for transportation fluid. The fluid transportation device comprises a valve main body, a valve chamber base, a valve membrane, an actuator and a cover body. The valve main body having a first assembling surface, comprises an inlet passage and an outlet passage respectively communicated with an inlet opening and an outlet opening on the first assembling surface. The valve chamber base comprises a second assembling surface, a third assembling surface, an inlet valve passage and an outlet valve passage. The inlet valve passage and the outlet valve passage are penetrating through the second assembling surface and the third assembling surface, the third assembling surface is partially sunken so as to form a compressible chamber which is communicated with the inlet valve passage and the outlet valve passage. The valve membrane has two valve plates. A plurality of extension brackets are disposed around peripheries of the valve plates to provide elastic support, a hollow hole is formed between each two of the adjacent extension brackets, and the inlet valve passage and the outlet valve passage of the valve chamber base are correspondingly closed by the valve plates within two penetration regions of the valve membrane, in which each of the valve plates forms a valve switch structure. The actuator is assembled by a vibration plate and a piezoelectric element, wherein the vibration plate has a first surface and an opposing second surface, the piezoelectric element is attached on the first surface of the vibration plate, and the second surface of the vibration plate covers the compressible chamber of the valve chamber base A plurality of penetration holes and a plurality of opening portions are disposed on the vibration plate where a plurality of electrically conductive locking elements are penetrating and be contacted therein. The locking elements are serving as a plurality of electrode leads of the vibration plate and the conductive area of the vibration plate is increased. The piezoelectric element has an electrode lead. The cover body is made of a metal, covering the vibration plate of the actuator and in contact with the vibration plate by a large area, wherein a plurality of screw holes are penetrated through the cover body. Two lead grooves are recessed respectively on two perpendicular surfaces of the cover body that are vertically communicated with each other. The penetration holes of the valve main body, the valve chamber base and the vibration plate respectively have a plurality of penetration holes in which the corresponding penetration holes are aligned with each other and corresponding to the screw holes of the cover body, the electrically conductive locking elements are correspondingly penetrated through the penetration holes to be locked with the corresponding screw holes, and a plurality of lead grooves respectively disposed on the vibration plate, the valve main body and the valve chamber base are corresponding to the two lead grooves of the cover body. The electrode lead of the piezoelectric element is embedded into the two lead grooves of the cover body and embedded into the lead grooves of the vibration plate, valve main body and the valve chamber base, so that the fluid transportation device is positioned and assembled.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 3:
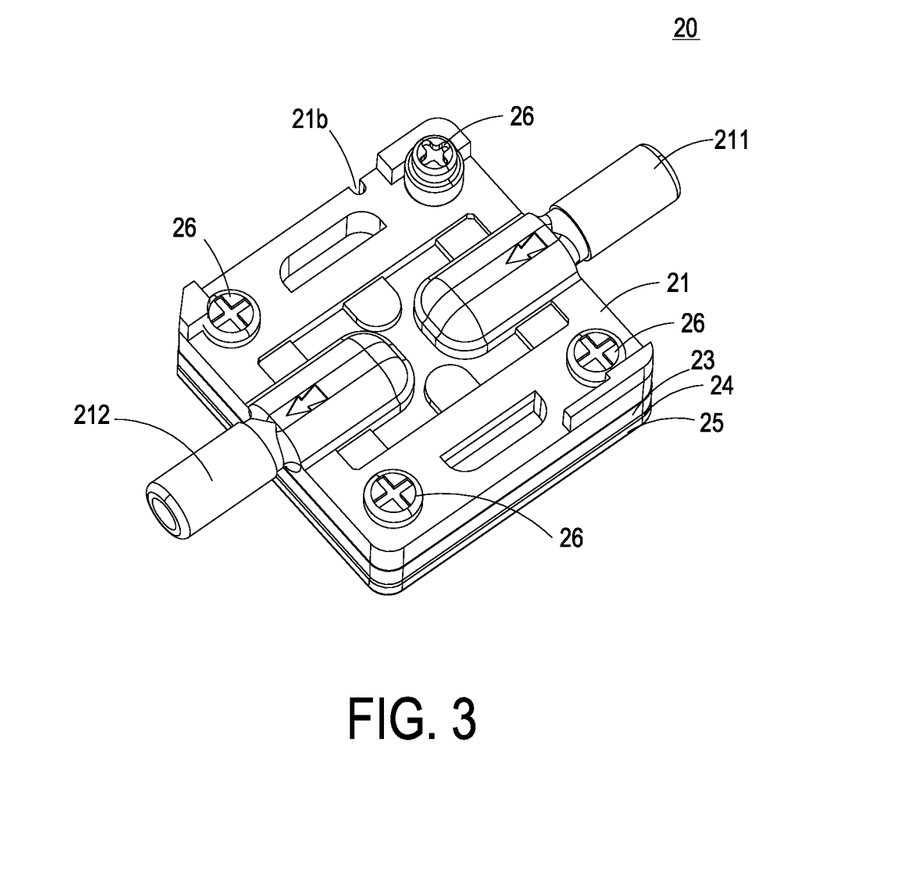
FIG. 3 schematically illustrates a perspective view of the fluid transportation device according to an embodiment of the present invention.
Figure 4:
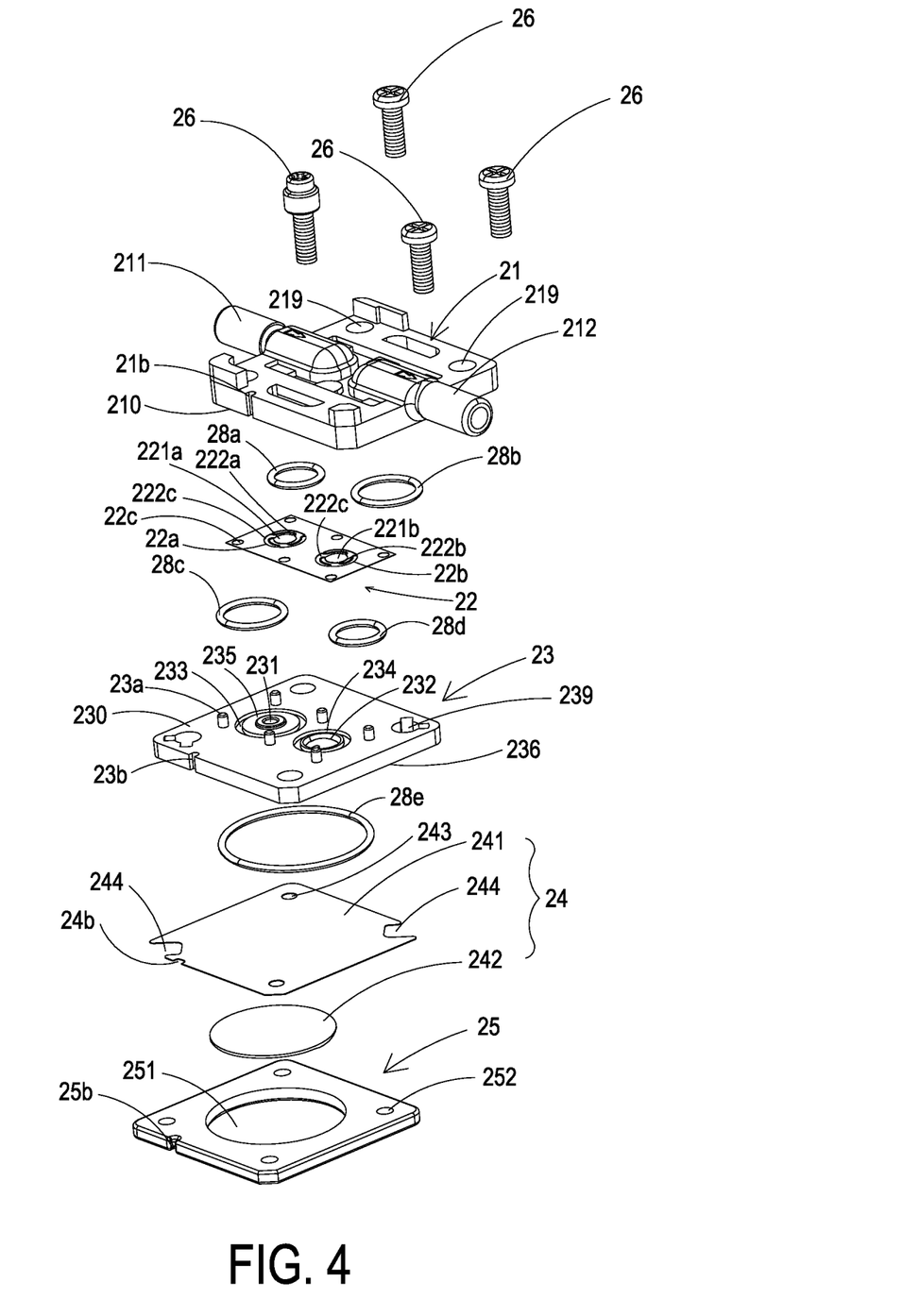
FIG. 4 schematically illustrates an exploded view of the fluid transportation device of FIG. 3.
Figure 5:
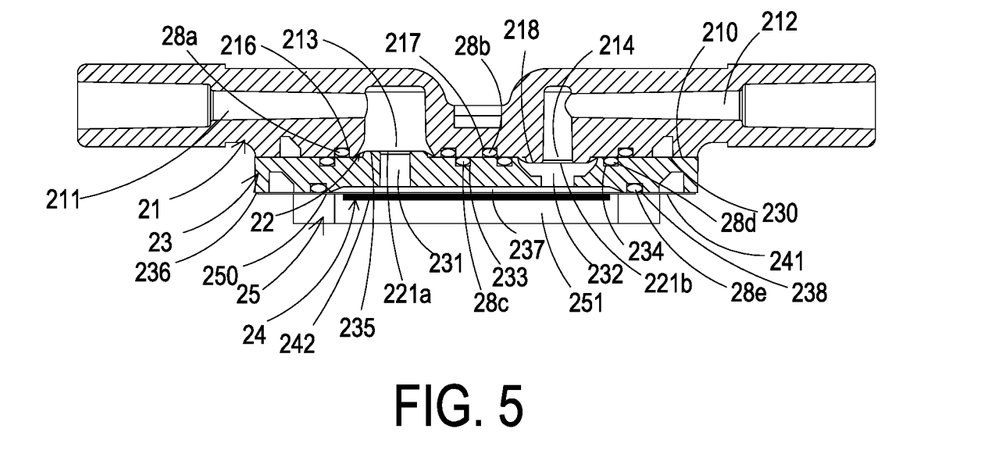
FIG. 5 schematically illustrates a sectional view of the fluid transportation device of FIG. 3.

Please refer to FIG. 3, FIG. 4 and FIG. 5. FIG. 3 schematically illustrates a perspective view of the fluid transportation device according to an embodiment of the present invention, and FIGS. 4 and 5 respectively illustrate an exploded view and a sectional view of the fluid transportation device of FIG. 3. The fluid transportation device 20 of the present invention can be applied to medical biotechnology, computer technology, printing or energy industry, and may be used to transport fluid, particularly to transport liquid. The fluid transportation device 20 is mainly assembled by a valve main body 21, a valve membrane 22, a valve chamber base 23, an actuator 24 and a cover body 25, which are sequentially stacked and to be joined and fixed by several locking elements 26. In the fluid transportation device 20, the valve main body 21, the valve membrane 22 and the valve chamber base 23 compose a fluid valve base, and there is a compressible chamber 237 formed between the valve chamber base 23 and the actuator 24 for storing fluid. The locking elements 26 may be conductive screws.

Figure 6:
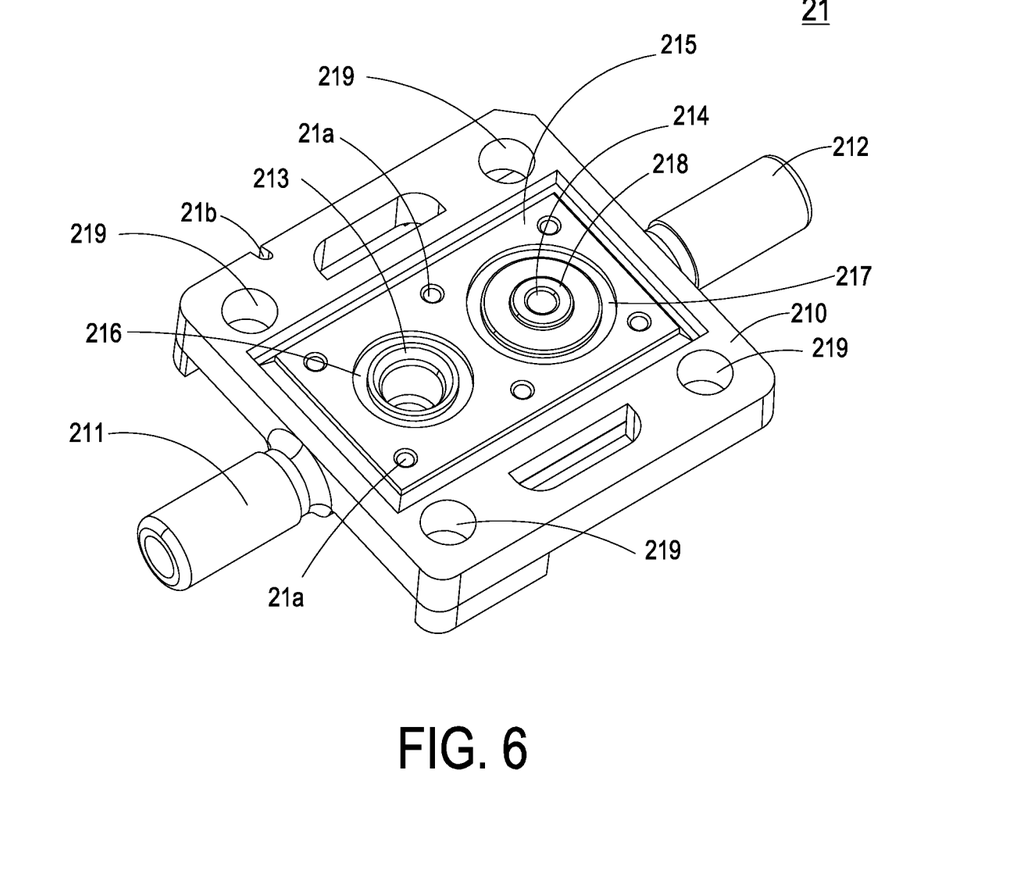
FIG. 6 schematically illustrates a bottom perspective view of the valve main body of the fluid transportation device of FIG. 3.

Please refer to FIG. 3, FIG. 4, FIG. 5 and FIG. 6. FIG. 6 schematically illustrates a bottom perspective view of the valve main body of the fluid transportation device of FIG. 3. The valve main body 21 and the valve chamber base 23 are the main components that guide fluid to enter and leave from the fluid transportation device 20. The valve main body 21 has an inlet passage 211 and an outlet passage 212. As shown in FIG. 6, the inlet passage 211 is communicated with an inlet opening 213 on a first assembling surface 210 of the valve main body 21. Similarly, the outlet passage 212 is communicated with an outlet opening 214 on the first assembling surface 210.

In this embodiment, the valve main body 21 further has an interconnection region 215 on the first assembling surface 210 in which two circular concave grooves 216 and 217 are respectively disposed around the peripheries of the inlet opening 213 and the outlet opening 214. The concave grooves 216 and 217 are for respectively inserting the seal rings 28a and 28b (see FIG. 4) that can prevent fluid leakage. In addition, within the interconnection region 215, a circular protruded structure 218 is disposed around the outlet opening 214. Meanwhile, a plurality of penetration holes 219 are respectively disposed on four corners of the valve main body 21 for penetrating the locking elements 26, a plurality of latch grooves 21a are disposed on the interconnection region 215, and a lead groove 21b is disposed on a side edge of the valve main body 21.

Figure 7:
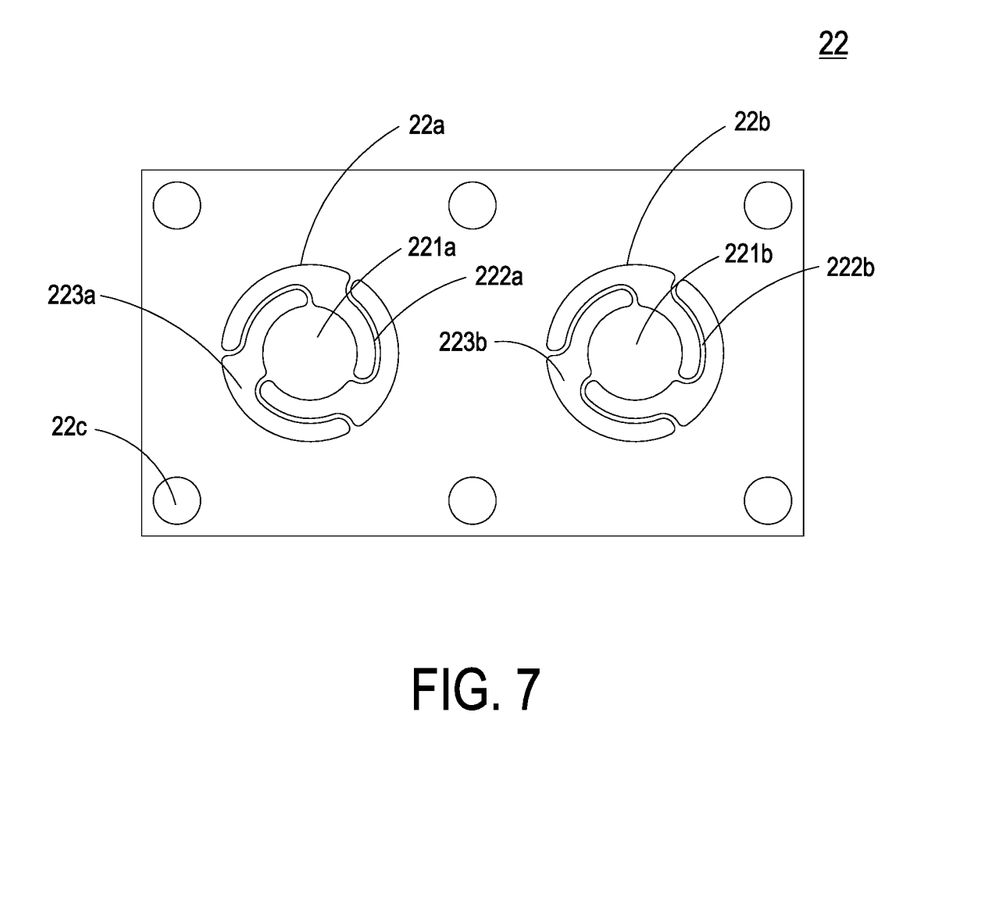
FIG. 7 schematically illustrates a top view of the valve membrane of the fluid transportation device of FIG. 3.

Please refer to FIG. 3, FIG. 4, FIG. 5 and FIG. 7. FIG. 7 schematically illustrates a top view of the valve membrane of the fluid transportation device of FIG. 3. The valve membrane 22 may be made of a polyimide (PI) based polymer film and manufactured by a means of reactive ion etching (RIE) method, in which a light-sensitive photoresist is coated on a region of the polyimide film representing a valve gate structure, and the pattern of the valve gate structure would be exposed to light to undergo an etching process. Since the region of the polyimide film coated with the photoresist is retained after the etching process, the valve gate structure of the valve membrane 22 is formed.

As shown in FIG. 7, the valve membrane 22 is a plane, slim sheet structure, having two penetration regions 22a and 22b which contain the valve plates 221a and 221b, respectively. The valve plates 221a and 221b have equal thickness, while a plurality of extension brackets 222a and 222b, which are in spiral shapes, are disposed around their peripheries for providing elastic support. A hollow hole 223a is formed between each of the adjacent extension brackets 222a, and a hollow hole 223b is formed between each of the adjacent extension brackets 222b. Since the valve plates 221a and 221b have been elastically supported by the extension brackets 222a and 222b, they would deform in a deformable displacement while enduring a force that making each of them a valve switch structure. The valve plates 221a and 221b may have the shapes including but not limited to a circle, a square, a rectangular or other geometric shapes. In this embodiment, the thickness of the valve membrane 22 is 50 micrometers, the diameter of each of the valve plates 221a and 221b is 17 millimeters, and the width of each of the extension brackets 222a and 222b is 100 micrometers. Moreover, a plurality of positioning holes 22c are disposed on the valve membrane 22. The amount of the positioning holes 22c shown in FIG. 7 is 6, but not limited herein.

Figure 8A:
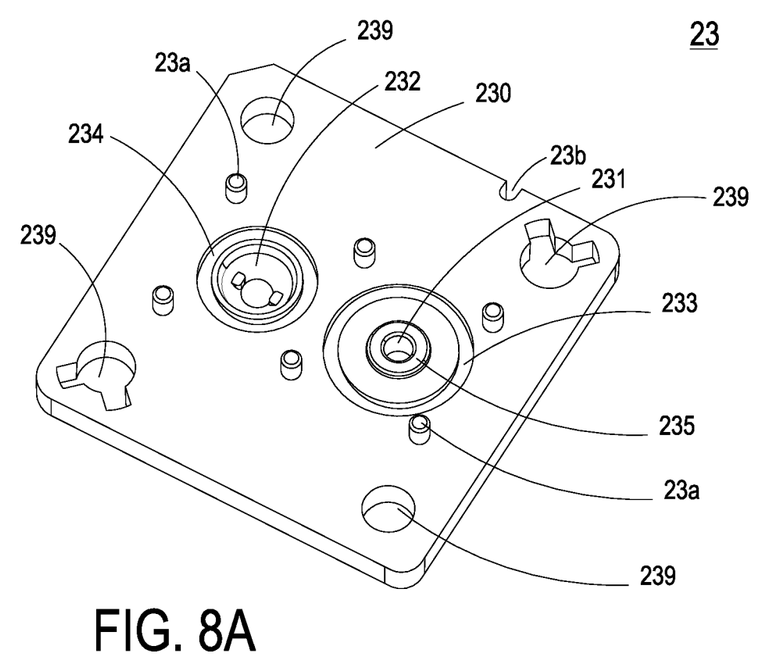
FIG. 8A schematically illustrates a top view of the valve chamber base of the fluid transportation device of FIG. 3.
Figure 8B:
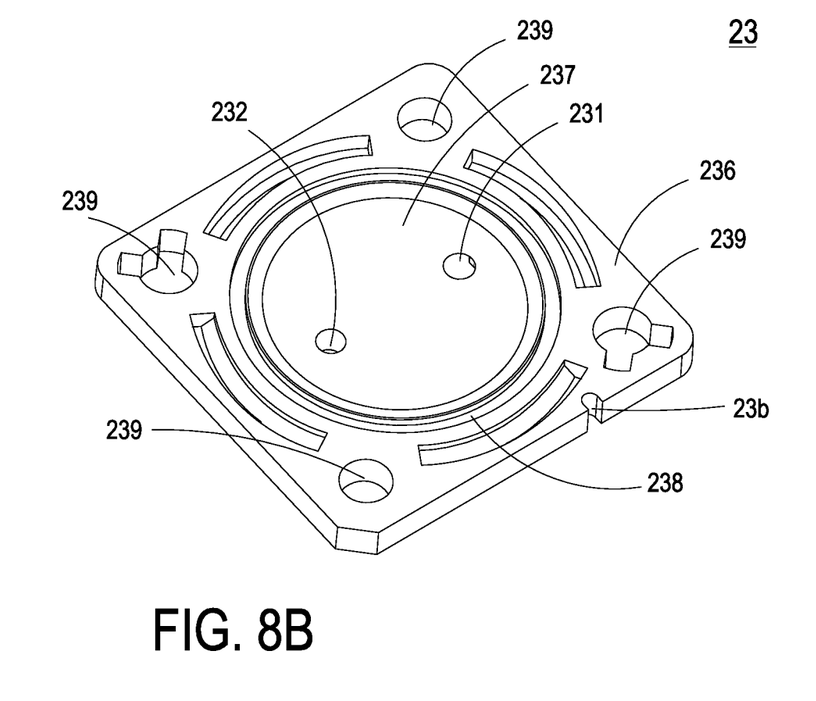
FIG. 8B schematically illustrates a bottom view of the valve chamber base of the fluid transportation device of FIG. 3.

Please refer to FIG. 3, FIG. 4, FIG. 5, FIG. 8A and FIG. 8B. FIGS. 8A and 8B respectively illustrates a top view and a bottom view of the valve chamber base of the fluid transportation device of FIG. 3. The valve chamber base 23 has a second assembling surface 230 and an opposing third assembling surface 236. Similar to the valve main body 21, the valve chamber base 23 also comprises an inlet valve passage 231 and an outlet valve passage 232, which are penetrating through the second assembling surface 230 and the third assembling surface 236. On the second assembling surface 230, two circular concave grooves 233 and 234 are respectively disposed on the peripheries of the inlet valve passage 231 and the outlet valve passage 232 for respectively inserting the seal rings 28c and 28d (see FIG. 4) that can prevent fluid leakage. Moreover, a protruded structure 235 is disposed around the opening of the inlet valve passage 231 on the second assembling surface 230.

As shown in FIG. 8B, the third assembling surface 236 is partially sunken so as to form the compressible chamber 237 in between the sunken portion of the third assembling surface 236 and the actuator 24 (see FIG. 5). The compressible chamber 237 is communicating with the inlet valve passage 231 and the outlet valve passage 232, and a circular concave groove 238 is disposed around the compressible chamber 237 for inserting a seal ring 28e (shown in FIG. 4) to prevent fluid leakage from the periphery of the compressible chamber 237. Moreover, a plurality of penetration holes 239 are respectively disposed on four corner of the valve chamber base 23 for penetrating the locking elements 26. As shown in FIG. 8A, a plurality of posts 23a are disposed on the second assembling surface 230 of the valve chamber base 23, and a lead groove 23b is disposed on a side edge of the valve chamber base 23.

Figure 9:
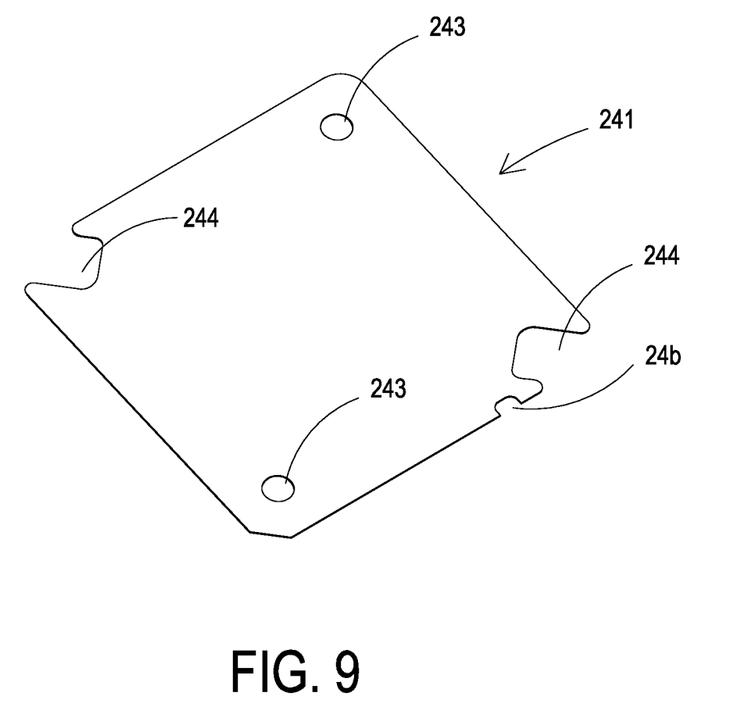
FIG. 9 schematically illustrates a top view of the vibration plate of the fluid transportation device of FIG. 3.

Please refer to FIG. 3, FIG. 4, FIG. 5 and FIG. 9. FIG. 9 schematically illustrates a top view of the vibration plate of the fluid transportation device of FIG. 3. As shown in FIG. 4, the actuator 24 is assembled by a vibration plate 241 and a piezoelectric element 242. The piezoelectric element 242 is adhered to a side surface of the vibration plate 241. The vibration plate 241 has two through holes 243 and two opening portions 244, wherein the through holes 243 are positioned opposite to each other diagonally, and so do the opening portions 244. The through holes 243 and the opening portions 244 are for inserting the locking element 26. Moreover, a lead groove 24b may be disposed on a side edge of the vibration plate 241.

Figure 11A:
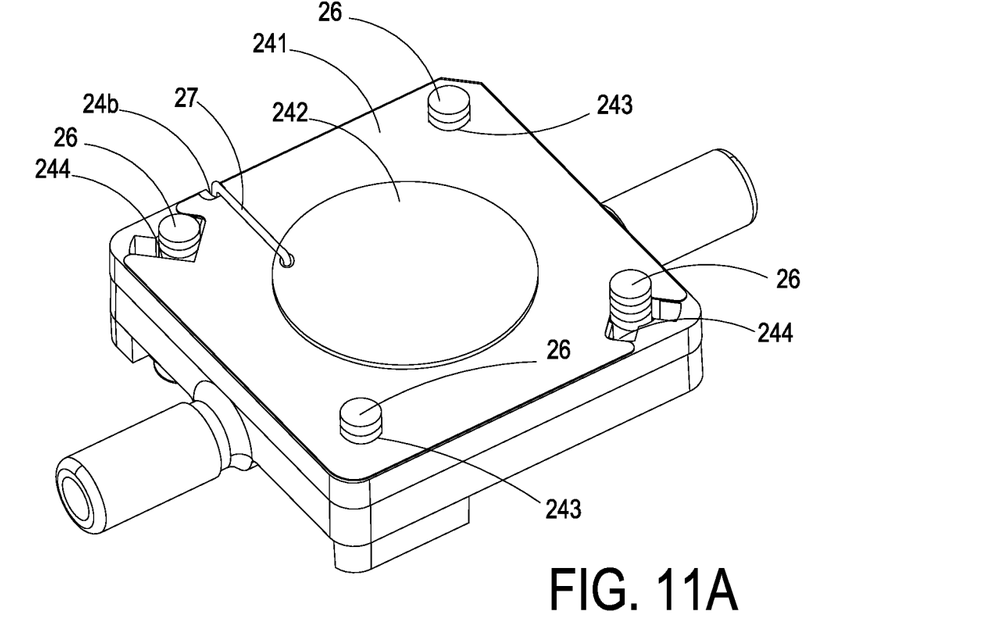
FIG. 11A schematically illustrates a bottom view of partial fluid transportation device without the cover body.
Figure 11B:
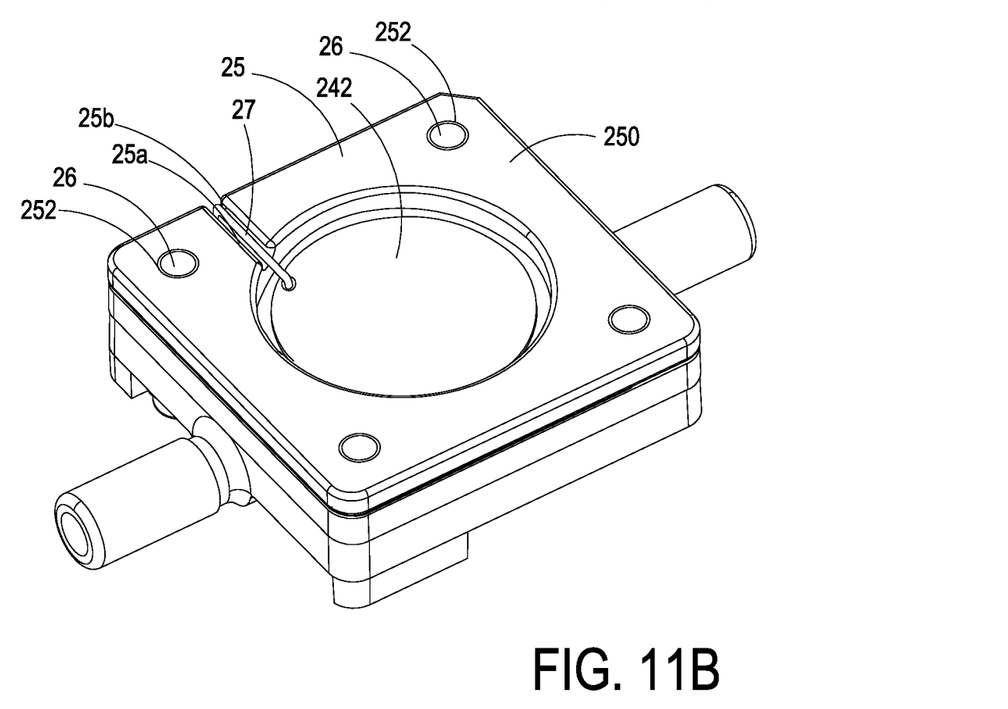
FIG. 11B schematically illustrates a bottom view of the fluid transportation device with the cover body.

In this embodiment, the vibration plate 241 is made of stainless steel, and the piezoelectric element 242 is made of piezoelectric powder of Lead zirconate titanate (PZT), which has high piezoelectric constant. The piezoelectric element 242 is electrically coupled with a driving circuit board (shown in FIG. 11C) through an electrode lead 27, as shown in FIG. 11A and FIG. 11B. As so, a voltage can be applied to the piezoelectric element 242 to drive the piezoelectric element 242 to deform, thus making the vibration plate 241 deform along with the piezoelectric element 242 and vibrate reciprocally along a vertical direction, by which the fluid transportation device 20 is driven to be in action.

Figure 10A:
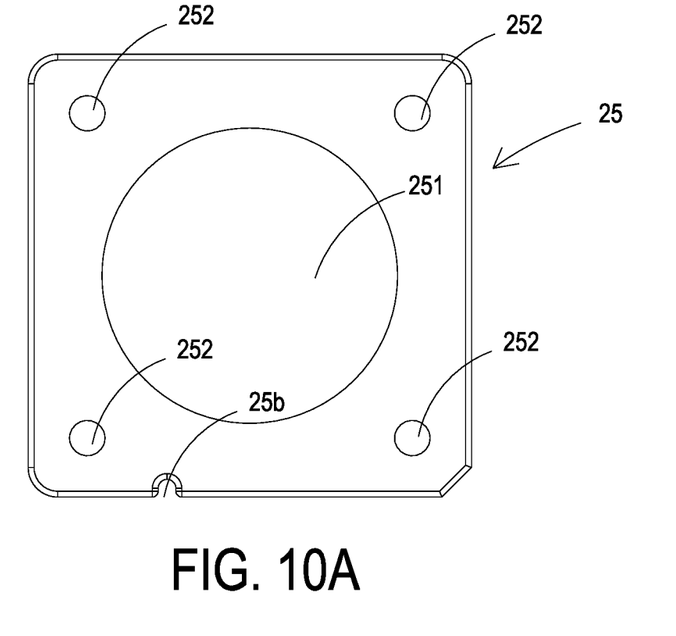
FIG. 10A schematically illustrates a top view of the cover body of the fluid transportation device of FIG. 3 transportation.
Figure 10B:
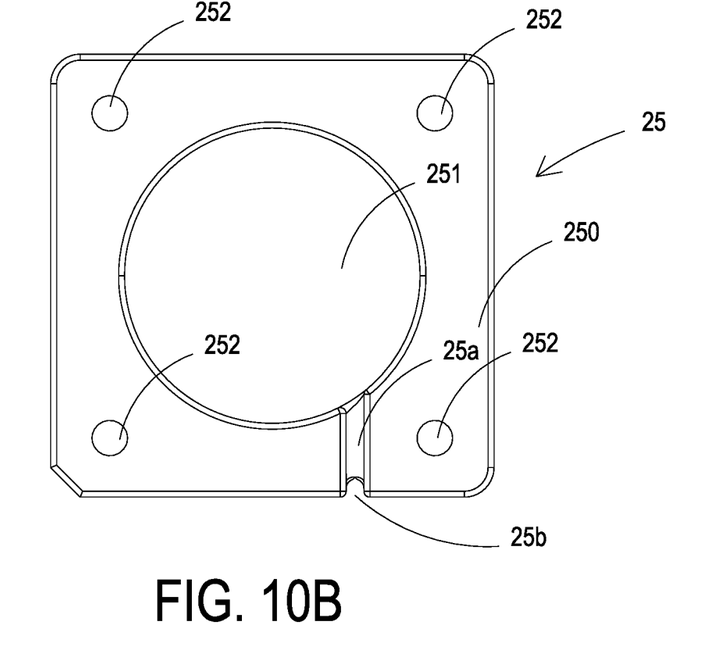
FIG. 10B schematically illustrates a bottom view of the cover body of the fluid transportation device of FIG. 3.

Please refer to FIG. 3, FIG. 4, FIG. 5, FIG. 10A and FIG. 10B. FIGS. 10A and 10B schematically illustrates a top view and a bottom view of the cover body of the fluid transportation device of FIG. 3, respectively. The cover body 25 may be made of a metal, having a hollow space 251 in the center and a plurality of screw holes 252 penetrating through the corners for inserting the locking element 26. A lead groove 25a is concaved on a surface 250 of the cover body 25, while another lead groove 25b is concaved on a side edge of the cover body 25 and vertically communicating with the lead groove 25a.

In this embodiment, the valve main body 21 and the valve chamber base 23 may be made of thermoplastic materials such as polycarbonate (PC), polysulfone (PSF), acrylonitrile butadiene styrene (ABS) resin, linear low density polyethylene (LLDPE), low density polyethylene (LDPE), high density polyethylene (HDPE), Polypropylene (PP), Polyphenylene Sulfide (PPS), Para-Polystyrene (SPS), Polyphenylene Oxide (PPO), Polyacetal (POM), Polybutylene Terephthalate (PBT), Polyvinylidene fluoride (PVDF), ethylene tetrafluoroethylene copolymer (ETFE), cycloolefin polymer (COC) and the like, but not limited herein.

It can be seen from the above description that the fluid transportation device 20 is mainly assembled by sequentially stacking the valve main body 21, the valve membrane 22, the valve chamber base 23, the actuator 24 and the cover body 25. Certainly, each layer can be welded through ultrasonic welding, thermal welding, or glue adhering for assembling and positioning. However, ultrasonic welding or thermal welding may cause over-melting in assembling process; regarding glue adhering, slow-drying glue requires too much time to dry out which makes time consuming process, and fast-drying glue usually leads the plastic members become embrittled. In order to overcome the above-mentioned problems, the present invention utilizes several locking elements 26 for positioning and locking the components, thereby assembling the fluid transportation device 20. Metal cover body 25 is suitable for twisting the locking elements 26 in to fasten and tighten the stacked structure, which is composed of the valve main body 21, the valve membrane 22, the valve chamber base 23, the actuator 24 and the cover body 25. Such stacked structure not only has improved leakproof protection, but also has strengthened structural strength.

Figure 11C:
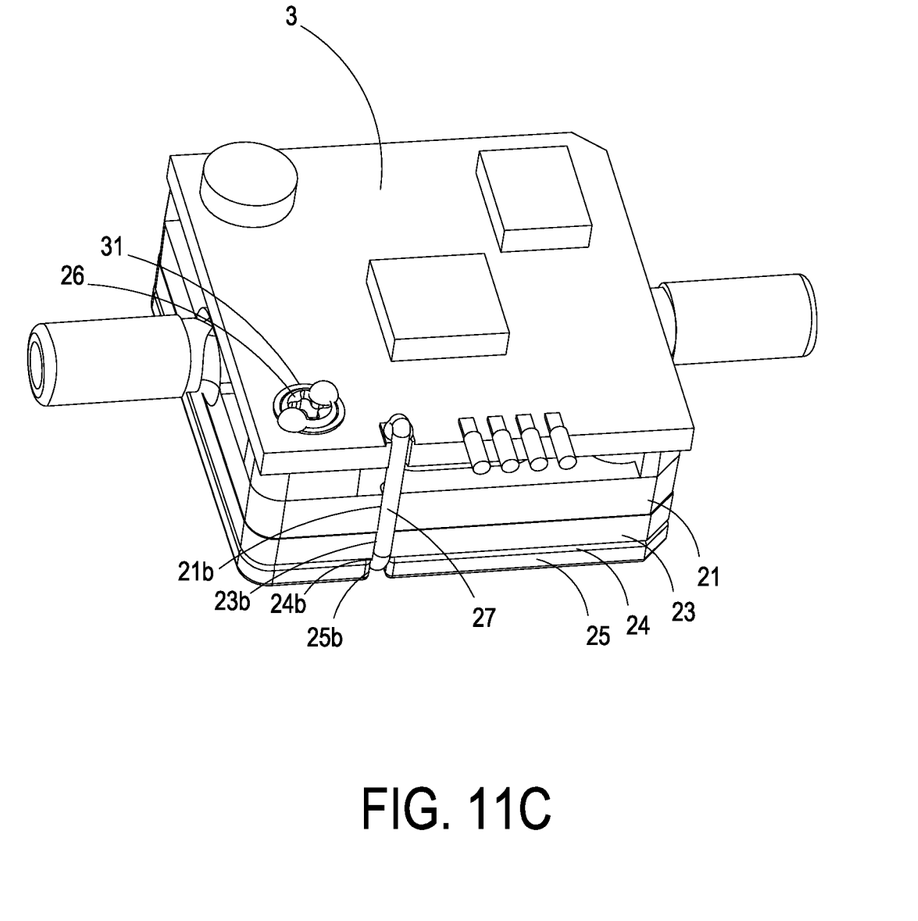
FIG. 11C schematically illustrates a top view of the fluid transportation device while a driving circuit board has been disposed thereon.

Please refer to FIG. 11A, FIG. 11B and FIG. 11C, which schematically illustrate a connection status of the electrode lead in the actuator of the fluid transportation device of FIG. 3. FIG. 11A shows a bottom view of partial fluid transportation device without the cover body; FIG. 11B shows a bottom view of the fluid transportation device with the cover body; FIG. 11C shows a top view of the fluid transportation device while a driving circuit board has been disposed thereon. In some embodiments, the present invention uses electrically conductive screws as the locking elements 26 to join, lock and position the components of the fluid transportation device 20. To apply voltage to the vibration plate 241, the electrically conductive screws as the locking elements 26 can also serve as conductive wires, since the locking elements 26 are contacting the vibration plate 241 by penetrating the through hole 243 and the opening portion 244 of the vibration plate 241.

As shown in FIG. 11C, a driving circuit board 3 is disposed on top of the fluid transportation device 20. One of the locking elements 26 is penetrating in a conductive counterbore 31 of the driving circuit board 3, and a soldered dot is welded on the locking element 26. As so, the locking element 26 is serving as a conductive wire that is capable of applying voltage to the vibration plate 241, thus simplifying conductive wiring of the device and decreasing the use of conductive wires. Moreover, since the metallic cover body 25 is covering the vibration plate 241 by its surface entirely contacting the vibration plate 241, and the conductive locking elements 26 are disposed in the screw holes 252 of the cover body 25, the area for conducting electricity of the vibration plate 241 is increased by which the problem of poor conduction of electricity is avoided. Furthermore, the conductive locking elements 26 can be used to slightly adjust performance of electricity conduction.

On the other hand, to apply voltage to the piezoelectric element 242, an electrode lead 27 is electrically connected between the piezoelectric element 242 and the driving circuit board 3, as shown in FIGS. 11A, 11B and 11C. As shown in FIG. 11B, the segment of the electrode lead 27 that is parallel to the bottom side of the fluid transportation device 20 is received in the lead groove 25a of the cover body 25. Whereas, as shown in FIG. 11C, the segment of the electrode lead 27 that is parallel to a lateral side of the fluid transportation device 20 is received in the lead groove 25b of the cover body 25, the lead groove 24b of the vibration plate 241, the lead groove 23b of the valve chamber base 23, and the lead groove 21b of the valve main body 21. The lead groove 25b of the cover body 25 is vertically communicating with the lead groove 25a formed on the surface 250 of the cover body 25, and a fillet is formed therebetween to prevent the electrode lead 27 from being broke or damaged by vertical edges of the cover body 27. Meanwhile, since the electrode lead 27 is embedded in the lead grooves 25a, 25b, 24b, 23b, and 21b, the electrode lead 27 is protected thereby, not easily being pulled by movement of any component and not vulnerable to impact damage.

The way of assembling the fluid transportation device 20 is exemplified in above-mentioned description. Firstly, the valve main body 21, the valve membrane 22, the valve chamber base 23, the actuator 24 and the cover body 25 are sequentially stacked. Afterwards, the four locking elements 26 are respectively sequentially passing through the penetration hole 219 of the valve main body 21, the penetration hole 239 of the valve chamber base 23 and the through hole 243/the opening portion 244 of the vibration plate 241, and to be locked with the screw hole 252 of the cover body 25 so that the fluid transportation device 20 is assembled.

Referring again to FIG. 4 and FIG. 5, the first assembling surface 210 of the valve main body 21 is relatively engaged with the second assembling surface 230 of the valve chamber base 23. Six positioning holes 22c of the valve membrane 22 are respectively sleeved in the posts 23a of the valve chamber base 23, so that the valve membrane 22 is positioned on the valve chamber base 23. The posts 23a of the valve chamber base 23 are correspondingly accommodated in the latch grooves 21a of the valve main body 21, and the valve membrane 22 is located between the valve main body 21 and the valve chamber base 23. The third assembling surface 236 of the valve chamber base 23 is relatively engaged with the vibration plate 241 of the actuator 24. The other surface of the vibration plate 241 of the actuator 24 is relatively engaged with the cover body 25. The piezoelectric element 242 of the actuator 24 is aligned with the hollow space 251 of the cover body 25. That is, the inlet valve passage 231 is disposed at a position corresponding to the inlet opening 213 of the valve main body 21, and the outlet valve passage 232 is disposed at a position corresponding to the outlet opening 214 of the valve main body 21. The valve plate 221a of the valve membrane 22 covers and seals the inlet valve passage 231 of the valve chamber base 23 and fits the protruded structure 235 to produce a prestress, by which the valve plate 221 can seal the inlet valve passage 231 tighter that prevents backflow. Similarly, the valve plate 221b of the valve membrane 22 also covers the outlet opening 214 of the valve main body 21, and fits the protruded structure 218 to generate a pre-force, by which the valve plate 221 can seal the outlet opening 214 tighter that prevents backflow. The vibration plate 241 of the actuator 24 covers the compressible chamber 237 of the valve chamber base 23. Meanwhile, in between the valve main body 21 and the valve chamber base 23, the seal rings 28a and 28b are disposed around the edges of the inlet opening 231 and the outlet opening 214, and the sealing rings 28c and 28d are disposed around the edges of the inlet valve passage 231 and outlet valve passage 232, so as to prevent fluid leakage. There is also a seal ring 28e disposed between the valve chamber base 23 and the vibration plate 241 to prevent fluid leakage to the periphery of the compressible chamber 237.

Figure 12A:
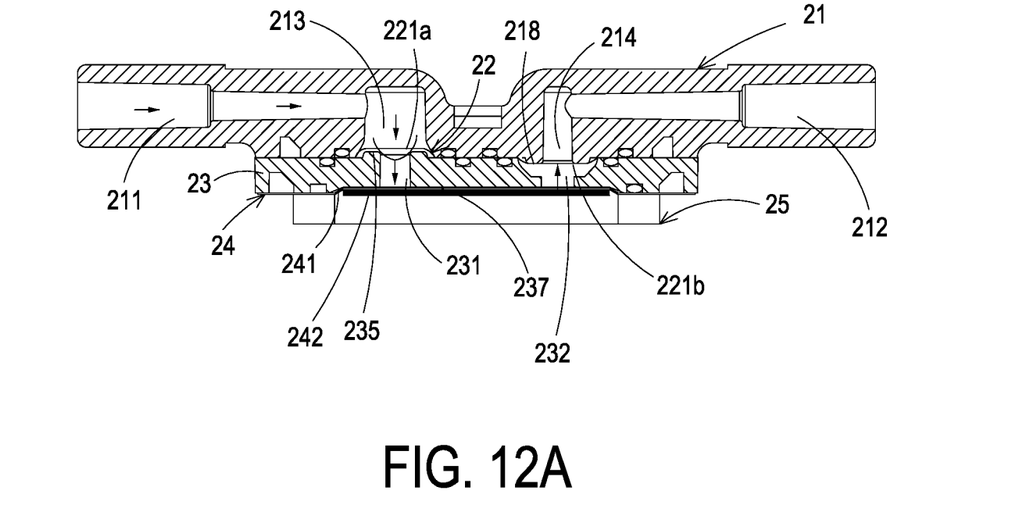
FIG. 12A schematically illustrates a first status of the fluid transportation of the fluid transportation device according to an embodiment of the present invention.
Figure 12B:
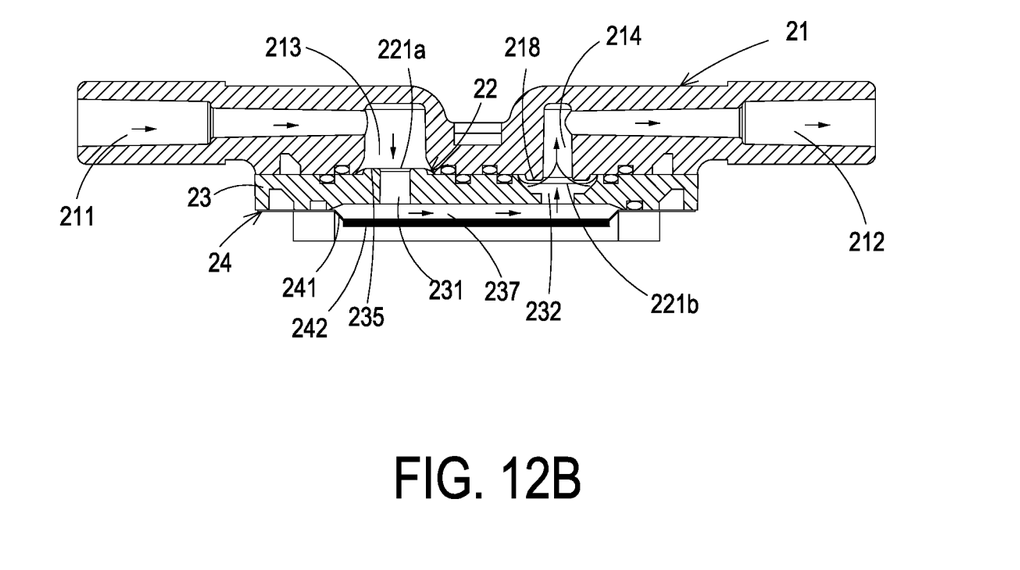
FIG. 12B schematically illustrates a second status of the fluid transportation of the fluid transportation device according to an embodiment of the present invention.

Please refer to FIG. 5, FIG. 7, FIG. 12A and FIG. 12B. FIGS. 12A and 12B schematically illustrates a first status and a second status of the fluid transportation of the fluid transportation device according to an embodiment of the present invention. The third assembling surface 236 of the valve chamber base 23 is partially recessed to form the compressible chamber 237, which is located in correspondence with the piezoelectric element 242 of the actuator 24 and is communicating with both the inlet valve passage 231 and the outlet valve passage 232. When the piezoelectric element 242 of the actuator 24 is applied to a voltage, the vibration plate 241 is deformed upwardly, as shown in FIG. 12A. Therefore, the volume of the compressible chamber 237 expands, and a pushing force is generated to lift the valve plate 221a of the valve membrane 22 to open, so that a large amount of fluid is sucked in, from the inlet passage 211 of the valve main body 21, through the inlet opening 213 of the valve main body 21, the hollow hole 223a of the valve membrane 22, the inlet valve passage 231 of the valve chamber base 23, to the compressible chamber 237. Meanwhile, in the outlet valve passage 232, the valve plate 221b of the valve membrane 22 is also affected by the pushing force and attached against the protruded structure 218 to be closed. Thereafter, when the direction of the electric field applied to the piezoelectric element 242 is changed inversely, the piezoelectric element 242 drives the vibration plate 241 to deform downwardly and concavely, as shown in FIG. 12B. Therefore, the volume of the compressible chamber 237 is contracted and decreased, so that the fluid in the compressible chamber 237 flows out of the compressible chamber 237 through the outlet valve passage 232. Simultaneously, some fluid also enters the inlet valve passage 231; however, the valve plate 221a of the valve membrane 22 is affected by a suction force and a flushing force brought by the fluid flowing from the inlet passage 211 to the inlet opening 213, attaching against the protruded structure 235 and to be closed. As so, the internal fluid in the compressible chamber 237 is prevented from passing through the valve plate 221a that generates a problem of backflow. At this time, the valve membrane 22 is also sucked by the pressure generated by expansion of the compressible chamber 237, and the valve plate 221b is moved downwardly to open. Hence, the fluid in the compressible chamber 237 can flow through the outlet valve passage 232 of the valve chamber base 23, the hollow holes 223b of the valve membrane 22, the outlet opening 214 and the outlet passage 212 of the valve main body 21 and flow out of the fluid transportation device 20, thus completing the fluid transportation process. By repeating the operations shown in FIG. 12A and FIG. 12B, the fluid transportation device 20 of the present invention implements the fluid flow without any backflow in the transportation process and achieve high efficiency of transportation.

From the above discussion, the present invention provides a fluid transportation device. The fluid transportation device is assembled by sequentially stacking a valve main body, a valve membrane, a valve chamber base, an actuator and a cover body, and locked and positioned the stack by several locking elements. Not only the entire structure can be adjusted in tighter connection, but also can prevent fluid leakage by disposing several seal rings around the peripheries of the inlet opening, the outlet opening, the inlet valve passage, the outlet valve passage and the compressible chamber. When the actuator is actuated, the volume of the compressible chamber is expended or contracted to generate a pressure difference, so that the valve plate structures of the valve membrane are closed or open that prevents backflow and improves efficiency of transportation. Moreover, the electrically conductive locking elements are used to simplify conductive wiring of the device, and the metallic cover body is in contact with the vibration plate by a whole surface that the area for conducting electricity of the vibration plate is increased. Hence, the poor conduction of electricity of the vibration plate is prevented, and the locking elements can be used to slightly adjust performance of conducting electricity. Furthermore, the electrode lead is embedded in and protected by several lead grooves so as to prevent damage. Advantageously, the fluid transportation device of the present invention provides significant improvement in fluid transportation technology.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fluid transportation device for transporting a fluid, comprising:

a valve main body having a first assembling surface, comprising an inlet passage and an outlet passage respectively communicated with an inlet opening and an outlet opening on the first assembling surface;

a valve chamber base having a second assembling surface and a third assembling surface, comprising an inlet valve passage and an outlet valve passage, wherein the inlet valve passage and the outlet valve passage are penetrating through the second assembling surface and the third assembling surface, the third assembling surface is partially sunken to form a compressible chamber which is communicated with the inlet valve passage and the outlet valve passage;

a valve membrane having two valve plates, wherein a plurality of extension brackets are disposed around peripheries of the valve plates to provide elastic support, a hollow hole is formed between each two of the adjacent extension brackets, and the inlet valve passage and the outlet valve passage of the valve chamber base are correspondingly closed by the valve plates within two penetration regions of the valve membrane, in which each of the valve plates forms a valve switch structure;

an actuator assembled by a vibration plate and a piezoelectric element, wherein the vibration plate has a first surface and an opposing second surface, the piezoelectric element is attached on the first surface of the vibration plate, and the second surface of the vibration plate covers the compressible chamber of the valve chamber base, wherein a plurality of penetration holes and a plurality of opening portions are disposed on the vibration plate where a plurality of electrically conductive locking elements are penetrating through and be contacted therein, so that the locking elements are serving as a plurality of electrode leads of the vibration plate and the conductive area of the vibration plate is increased, wherein the piezoelectric element has an electrode lead;

a cover body made of a metal, covering the vibration plate of the actuator and in contact with the vibration plate by a large area, wherein a plurality of screw holes are penetrated through the cover body, and two lead grooves are recessed respectively on two perpendicular surfaces of the cover body that are vertically communicated with each other;

wherein the valve main body, the valve chamber base and the vibration plate respectively have a plurality of penetration holes in which the corresponding penetration holes are aligned with each other and corresponding to the screw holes of the cover body, the electrically conductive locking elements are correspondingly penetrated through the penetration holes to be locked with the corresponding screw holes, and a plurality of lead grooves respectively disposed on the vibration plate, the valve main body and the valve chamber base are corresponding to the two lead grooves of the cover body, and the electrode lead of the piezoelectric element is embedded into the two lead grooves of the cover body and embedded into the lead grooves of the vibration plate, valve main body and the valve chamber base, so that the fluid transportation device is assembled.

2. The fluid transportation device according to claim 1, wherein a protruded structure is disposed on each of a periphery of the outlet opening of the valve main body and a periphery of the inlet valve passage of the valve chamber base, the valve plates within the two penetration regions of the valve membrane are operable to abut against the protruded structures by which a prestress is produced to make the valve plates seal tighter to prevent backflow.

3. The fluid transportation device according to claim 1, wherein a concave groove is disposed on each of the peripheries of the inlet opening and the outlet opening of the valve main body, the peripheries of the inlet valve passage and the outlet valve passage on the second assembling surface of the valve chamber base, and a periphery of the compressible chamber on the third assembling surface, for disposing a seal ring to prevent fluid leakage.

4. The fluid transportation device according to claim 1, wherein a plurality of latch grooves are disposed on the first assembling surface of the valve main body, a plurality of posts are disposed on the second assembling surface of the valve chamber base, and the posts are correspondingly accommodated within the latch grooves of the valve main body, so that the valve chamber base is positioned on the valve main body, wherein a plurality of positioning holes are disposed on the valve membrane corresponding to the posts of the valve chamber base, so that each of the posts is penetrated through corresponding positioned hole on the valve membrane, and the inlet valve passage and the outlet valve passage of the valve chamber base are correspondingly closed by the valve plates of the valve membrane, in which each of the valve plates forms the valve switch structures.

5. The fluid transportation device according to claim 1, wherein the locking elements are screws.

\* \* \* \* \*